United States Patent [19]
Mitsui et al.

[11] Patent Number: 5,183,771
[45] Date of Patent: Feb. 2, 1993

[54] METHOD OF MANUFACTURING LDDFET HAVING DOUBLE SIDEWALL SPACERS

[75] Inventors: Katsuyoshi Mitsui; masahide Inuishi, both of Hyogo, Japan

[73] Assignee: Mitsubishi Denki Kabushiki Kaisha, Tokyo, Japan

[21] Appl. No.: 732,541

[22] Filed: Jul. 19, 1991

Related U.S. Application Data

[62] Division of Ser. No. 462,536, Jan. 3, 1990, Pat. No. 5,089,865.

[30] Foreign Application Priority Data

Jan. 7, 1989 [JP] Japan .................. 1-1602

[51] Int. Cl.$^5$ .......................... H01L 21/336
[52] U.S. Cl. .................. 437/44; 437/238; 437/200; 257/344; 257/384; 257/900
[58] Field of Search .............. 437/27, 40, 41, 44, 437/35, 235, 238, 192, 200; 357/23.3

[56] References Cited

U.S. PATENT DOCUMENTS

| | | | |
|---|---|---|---|
| 4,356,623 | 11/1982 | Hunter | 437/44 |
| 4,419,809 | 12/1983 | Riseman et al. | 437/44 |
| 4,771,012 | 9/1988 | Yabu et al. | 437/35 |
| 4,855,246 | 8/1989 | Codella et al. | 437/44 |
| 4,894,694 | 1/1990 | Cham et al. | 437/44 |
| 4,949,136 | 8/1990 | Jain | 357/23.3 |
| 4,963,504 | 10/1990 | Huang | 437/44 |
| 5,091,763 | 2/1992 | Sanchez | 437/192 |

FOREIGN PATENT DOCUMENTS 58-132951 8/1983 Japan .
62-49664 3/1987 Japan .

OTHER PUBLICATIONS

Author Unknown, "Simplified Lightly Doped Drain Process" IBM Technical Disclosure Bulletin, vol. 30, No. 12, May 1988, pp. 180–181.

Author Unknown, "Lightly Doped Drain Structure With Reduced Series Resistance to Device Channel," IBM Technical Disclosure Bulletin, vol. 32, No. 3A, Aug. 1989, pp. 485–486.

Ghandhi, *VLSI Fabrication Principles,* John Wiley and Sons, 1983, pp. 435–439.

Ryuichi Izawa et al. "The Impact of Gate-Drain Overlapped LDD (Gold) for Deep Submicron VLSI's", IEDM 87 (1987) pp. 38–41.

*Primary Examiner*—Mary Wilczewski
*Attorney, Agent, or Firm*—Lowe, Price, LeBlanc & Becker

[57] ABSTRACT

In an MIS transistor of a type having LDD and salicide structures, the location of the boundary between the high and low impurity density source/drain regions and the positions of the salicide layers on the source/drain regions are independently controlled during fabrication using a double gate sidewall structure. An MIS transistor improved thereby has its boundary between the high and low impurity density source/drain regions at or displaced toward the control gate electrode with respect to the interface of the double gate sidewall structure.

11 Claims, 5 Drawing Sheets

METHOD OF MANUFACTURING LDDFET HAVING DOUBLE SIDEWALL SPACERS

This application is a division of application Ser. No. 07/462,536 filed Jan. 3, 1990, now U.S. Pat. No. 5,089,865.

BACKGROUND OF THE INVENTION

Field of the Invention

The present invention relates to a MIS semiconductor device and a method of manufacturing thereof and, more particularly, to an improvement of a method for manufacturing source and drain regions of a MIS transistor comprising a salicide structure reducing wiring resistance and the like and a LDD (Lightly Doped Drain) structure preventing a short channel effect.

Description of the Background Art

A semiconductor device having a stacked structure of metal-insulator-semiconductor is called a MIS semiconductor device. A transistor using an oxide film as the insulator is especially called a MOSFET (Field Effect Transistor). FIG. 4 shows a cross sectional structure of a typical MOSFET. The MOSFET comprises a pair of source•drain regions (n type) 12•12 on a surface of a silicon substrate 1, a gate oxide film 2 formed on the substrate between the source•drain, and a gate electrode 3 formed on the surface of the gate oxide film 2. The surface area of the substrate between the source•drain regions 12•12 is called a channel region 8. The length of the channel region 8 is represented by the reference character L in the figure.

In operation, a prescribed potential $V_D$ is applied between the source•drain 12•12. When a gate voltage $V_G$ larger than the threshold voltage $V_{TH}$ is applied to the gate electrode 3, an n type inverted layer 20 where electrons are induced is formed in the channel region 8. Consequently, a drain current $I_D$ flows between the source and the drain 12•12. A depletion layer 30 extends around the source and the drain regions 12•12.

A structure of a MIS (Metal Insulator Semiconductor) transistor has been miniaturized as technique for high degree of integration density and high speed responsiveness in a semiconductor device has made advances. The MIS transistor is miniaturized by shortening a channel length or forming source and drain regions having a shallow junction in accordance with a scaling rule in principle.

However, the following two problems were particularly raised along with the miniaturization of the MIS transistor.

(1) The short channel effect due to the shortening of the channel of the transistor becomes conspicuous.

Because of the short channel effect, a breakdown phenomenon and a hot electron effect are generated in the vicinity of the drain, so that a life for reliability is decreased and the transistor characteristic is degraded.

One of the short channel effect is hot electron effect. Referring to FIG. 5, a strong electric field is generated near the drain of a MISFET (MOSFET) having a short channel. Electrons introduced to this strong electric field region generate hot carriers by impact ionization. Part of the generated hot carriers are caught by traps or the like in the gate oxide film 2 of the MOSFET and are accumulated as time passes. The accumulated carriers cause changes of the threshold voltage $V_{TH}$ with time and deterioration of mutual conductance, significantly reducing the reliability of the MOSFET.

(2) Wiring resistance of an impurity diffusion layer and a gate electrode layer becomes conspicuous.

At the source•drain regions, the resistance is increased as the junction depth becomes shallower and a conductive area becomes smaller. At the gate electrode, the resistance is increased as the gate length becomes shorter and the conductive area becomes smaller.

Because of the increase in wiring resistance, the high speed responsiveness of the transistor is degraded.

As a structure for eliminating these problems, a LDD structure was adopted to prevent the short channel effect and, in addition, as a structure for preventing the increase in wiring resistance, a salicide structure was proposed. FIG. 6 is a diagram of a conventional MIS transistor having such structure.

Referring to the figure, a gate electrode 3 comprising polysilicon is formed on a p type silicon substrate 1 through a gate oxide film 2. Sidewall spacers 4 and 4 serving as insulating films are formed on either side of the gate electrode 3. n⁻ impurity regions 5 and 5 with low concentration are formed at a self-aligning position with the gate electrode 3 on the p type silicon substrate 1. In addition, n⁺ impurity regions 6 and 6 with high concentration are formed at a self-aligning position with the sidewall spacers 4 and 4. Each n⁻ impurity region 5 and n⁺ impurity region 6 constitute a source and drain region 12 of the transistor. In addition, a structure of the impurity region having a structure in which the positions of the n⁻ impurity region 5 with low concentration and the n⁺ impurity region 6 with high concentration are offset is referred to as a LDD structure. Also, salicide layers 7a, 7b and 7b comprising titanium silicide are formed on the upper surface of the gate electrode 3 and the surface of the n⁺ impurity regions 6 and 6. A structure of the silicide layers 7a, 7b and 7b formed in a self-alignment manner on the gate electrode 3 and the n⁺ impurity regions 6 and 6 is referred to as a "salicide structure".

The n⁻ impurity regions 5 and 5 with low concentration constituting the LDD structure are structured such that impurity concentration distribution between the n⁺ impurity regions 6 and 6 with high concentration and a channel region 8 just beneath the gate electrode 3 may be made gently-sloping. As a result, electric field concentration particularly on the side of the drain region is mitigated and the generation of the breakdown phenomenon and hot carriers are restrained.

In addition, the silicide layers 7a and 7b constituting the salicide structure is superior in conductivity. The wiring resistance of the gate electrode 3 and the sheet resistance of the source and drain regions 12•12 are reduced in virtue of this excellent conductivity.

However, the LDD MOSFET additionally causes the following two problems.

The first problem is that the newly disposed n⁻ impurity region at low concentration constitutes a parasitic resistance to thereby reduce the driving performance of the MOSFET. This is to be explained referring to FIGS. 7A and 7B.

The operation of MOSFET is divided in two types, that is, a pentode region in which the drain voltage $V_D$ is greater than the gate voltage $V_G$ (FIG. 7A) and a triode region in which the gate voltage $V_G$ is much greater than the drain voltage $V_D$ (FIG. 7B). In the pentode region shown in FIG. 7A, a depleted high resistance region is formed between the inversion layer 8 and the drain regions 5a, 6a comprising n−/n+ impurity region. In addition to the resistance of a channel comprising the inversion layer 8, the resistance R1 of the n− impurity region 5b at low concentration on the side of the source, as the parasitic resistance, result in the reduction of the drain current. Further, in the triode region, the resistance R1 of the n− impurity region 5b on the side of the source and the resistance R2 of the n− impurity region 5a on the side of the drain, as the parasitic resistance, lower the driving performance of the MOSFET.

The second problem is relevant to hot carriers. That is, in the drain structure of conventional LDD MOSFETs, hot carriers having greater energy than the thermal equilibrium state are formed on the surface of the n− impurity region 5a at low concentration and the thus generated hot carriers are implanted into the sidewall spacers 4 of the gate electrode 3. As a result, the surface of the n − impurity region 5a on the side of the drain is depleted, by which the resistance in this region is increased to deteriorate the drain characteristics of the MOSFET.

Referring to FIGS. 8A to 8D, a description is made of manufacturing steps of the conventional MIS transistor shown in FIG. 6.

Referring to FIG. 8A, a thin gate oxide film 2 is formed on a p type silicon substrate 1. Then, a polysilicon layer is formed on the surface of the gate oxide film 2 to form a gate electrode 3 by patterning the gate oxide film 2 and the polysilicon layer. n type impurity ions 9 are implanted on the p type silicon substrate 1 with a small dosage using the gate electrode 3 as a mask to form n− impurity regions 5 and 5.

Referring to FIG. 8B, a silicon oxide film of the thickness of 2000~3000 Å is formed on the p type silicon substrate 1 on which the gate electrode 3 was formed. Then, sidewall spacers 4 and 4 are formed on either side of the gate electrode 3 by performing anisotropic etching on this silicon oxide film. Next, the n type impurity ions 9 are implanted on the p type silicon substrate 1 with a large dosage using this sidewall spacers 4 and 4 and the gate electrode 3 as a mask to form n+ impurity regions 6 and 6.

Referring to FIG. 8C, a refractory metal layer 11 such as titanium is evaporated on the surface of the p type silicon substrate 1, the gate electrode 3 and the sidewall spacers 4 and 4. Thereafter, high temperature heat treatment is performed and the refractory metal layer 11 is made to react with the polysilicon layer of the gate electrode 3 in contact with this refractor metal layer 11 to form a silicide layer of the refractory metal layer 11 on the region between both layers. The heat treatment was done by RTA lamp annealing method in N2 gas atmosphere at 600° C.

Referring to FIG. 8D, silicide layers 7a, 7b and 7b are formed in a self-alignment manner on the surface of the gate electrode 3 and the n+ impurity regions 6 and 6 by removing the unreacted refractory metal layer 11 evaporated on the surface of the sidewall spacers 4 and 4.

As shown in FIGS. 8A to 8D, the sidewall spacers 4 and 4 fulfill two functions. First, they function as a mask to selectively form the silicide layer of the refractory metal layer 11. The sidewall spacer does not react with the refractory metal layer 11. Therefore, the regions on which the refractory metal layer 11 is silicified are separately formed in a self-alignment manner by the sidewall spacer on the surface of the gate electrode 3 and the source and drain region. In order to perform this separation reliably, the thickness $t_s$ of the sidewall spacer 4 is to be 2000~3000 Å.

Secondly, it functions to define the offset length $1_{off}$ of the n− impurity region 5 and n+ impurity region 6 of the source and drain region. That is, the length of the n− impurity region 5 constituting the LDD structure is substantially defined by the film thickness of this sidewall spacer 4. However, since the thickness of the sidewall spacer 4 is formed thickly because of the first function, the length of the n− impurity region 5 is also formed long. This n− impurity region 5 controls the short channel effect by mitigating an electric field concentration and preventing the generation of the breakdown phenomenon, while serving as parasitic resistance. The longer the n− impurity region 5 becomes, the more the parasitic resistance increases, so that a problem degrading the responsiveness of a transistor has become noticeable.

SUMMARY OF THE INVENTION

An object of the present invention is to provide an MIS semiconductor device having a LDD and a salicide structure.

Another object of the present invention is to provide an improved self-alignment in the manufacture of MIS device having a LDD and a salicide structures.

A further object of the present invention is to provide an improved MIS or MOS device having independently dimensioned LDD and salicide structures.

A further object of the present invention is to optimize the dimension of the impurity region with low concentration of the LDD structure in the MOS semiconductor device having the LDD and the salicide structures.

The MIS semiconductor device of the present invention has a so-called LDD structure and a salicide structure. In addition, double sidewall spacers are formed on the sidewalls of the gate electrode. The salicide structure is formed in self-alignment on the surface of the high concentration impurity region of the LDD structure and on the surface of the gate electrode. The boundary between the low concentration impurity region and a high concentration impurity region of the LDD structure is positioned, at least beneath the first sidewall spacer in contact with the sidewall of the gate electrode.

According to the method for manufacturing the MIS semiconductor device in accordance with the present invention, a two-layer sidewall spacer is formed on a sidewall of a gate electrode. Each of first and second sidewall spacers is formed with an independent optimal film thickness. First, the first sidewall spacer is formed on the sidewall of the gate electrode to define the length of the impurity region with relatively low concentration of the source and drain region. By adjusting the film thickness of the first sidewall spacer, there can be provided the LDD structure in which parasitic resistance is small and the short channel effect can be reliably controlled.

In addition, the second sidewall spacer is formed on the sidewall of the first sidewall spacer. Then, the separation length of the silicide layer formed on the surface of the gate electrode and source and drain region is defined by the film thickness of the first sidewall spacer and the second sidewall spacer. By using this second sidewall spacer, the salicide and LDD structures can be formed under optimal conditions, making independent a relation between the condition forming the source and drain region of the LDD structure and the condition forming the separation of the silicide structure.

As a result, it becomes possible to implement the MIS structure device and having an excellent transistor characteristic by preventing the short channel effect by the LDD structure, reducing the resistance of the wiring layer and the like by the silicide structure and being miniaturized by this mutual actions.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Referring to figures, a description is made of one embodiment of the present invention.

Figure 1:
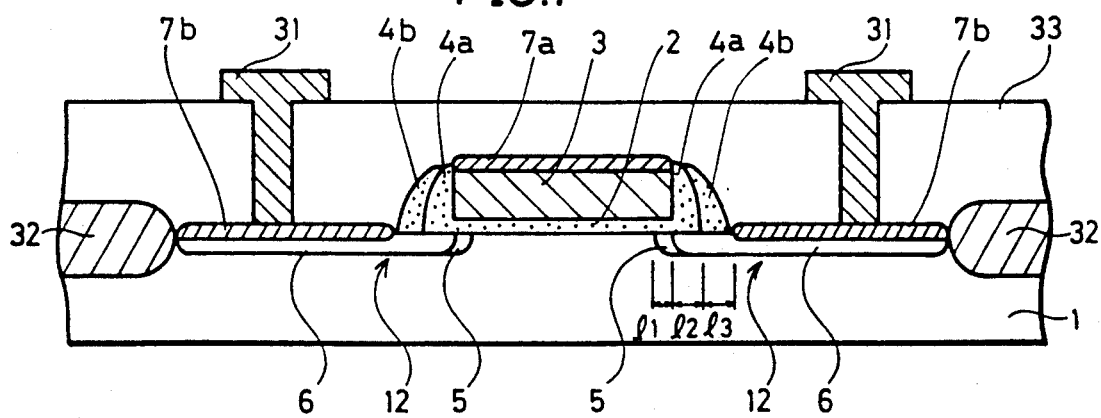
FIG. 1 is a sectional view of a MIS transistor manufactured by a method in accordance with the present invention.

Referring to FIG. 1, a gate electrode 3 comprising polysilicon is formed on a p type silicon substrate 1 through a gate oxide film 2. First sidewall spacers 4a and 4a are formed on the sidewalls of the gate electrode 3. In addition, second sidewall spacers 4b and 4b are formed on the sidewalls of the first sidewall spacers 4a and 4a. Source and drain regions 12 and 12 comprising an n$^-$ impurity region 5 with low concentration and an n impurity region 6 with high concentration are formed on the p type silicon substrate 1. The upper portions of the n$^-$ impurity regions 5 and 5 are almost covered with the gate electrode 3. The interface between the n$^+$ impurity region 6 and the n$^-$ impurity region 5 almost corresponds to the sides of the gate electrode 3. Typical dimensions of the n$^-$/n$^+$ impurity regions and of the sidewall spacers 4a and 4b are, referring to the reference characters in FIG. 1, $l_1 = 2000$ Å, $l_2 = 1000$ Å and $l_3 = 2000$ Å, respectively. In addition, silicide layers 7b, 7b and 7a such as titanium silicide are formed on the surface of the source and drain regions 12 and 12 and the surface of the gate electrode 3. Structure having the silicide layers 7a, 7b and 7b formed in a self-alignment manner on the surface of the gate electrode 3 and the source and drain regions 12 and 12 constitutes the salicide structure. Wiring layers 31, 31 are connected to the source drain regions 12, 12, respectively. A thick field oxide film 32 surrounds the transistor region on the p type silicon substrate. The surface of the MOS transistor is covered with an interlayer insulating layer 33.

Referring to FIGS. 2A to 2H, a description is made of a method for manufacturing the MIS transistor in accordance with this embodiment in order of its manufacturing steps.

Figure 2A:
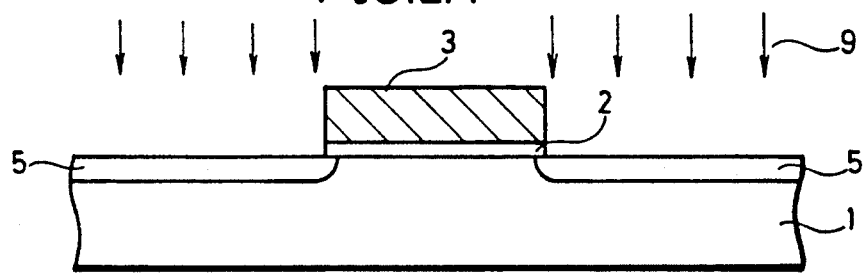
FIGS. 2A, 2B, 2C, 2D, 2E, 2F, 2G and 2H are sectional views of the MIS transistor in accordance with the present invention showing its manufacturing steps.

As shown in FIG. 2A, a gate oxide film 2 is formed on a p type silicon substrate 1. Then, a polysilicon layer is formed on the gate oxide film 2 and then the gate oxide film 2 and the polysilicon layer are patterned to be a predetermined configuration to form a gate electrode 3. Then, n type impurity ions 9 such as phosphorus (P) or arsenic (As) are implanted by a dosage of approximately $1 \times 10^{13}/cm^2$ using the gate electrode 3 as a mask. As a result, n$^-$ impurity regions 5 and 5 with low concentration are formed on the surface of the p type silicon substrate 1. This ion implantation may be performed using a diagonal ion implantation method by which impurity ions are implanted diagonally to the surface of the p type silicon substrate 1. When this method is used, the edge of the n$^-$ impurity region 5 enters just beneath the gate electrode 3.

Figure 2B:
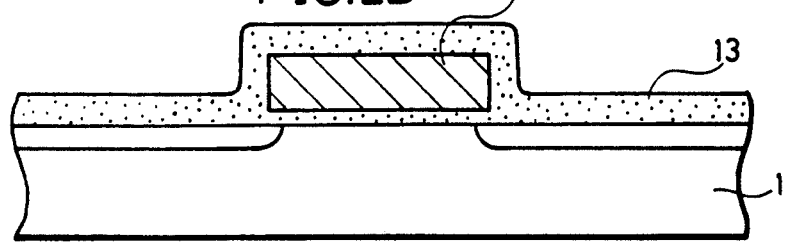

As shown in FIG. 2B, a first silicon oxide film 13 is formed on the surface of the p type silicon substrate 1 and the gate electrode 3 using a reduced pressure CVD (Chemical Vapor Deposition) method. The thickness of the first silicon oxide film 13 defines the length of the n$^-$ impurity region 5 in a channel direction. Therefore, the thickness of the first silicon oxide film 13 is set from the viewpoint of optimizing the transistor characteristic. The film thickness is approximately 1000 Å in this embodiment.

Figure 2C:
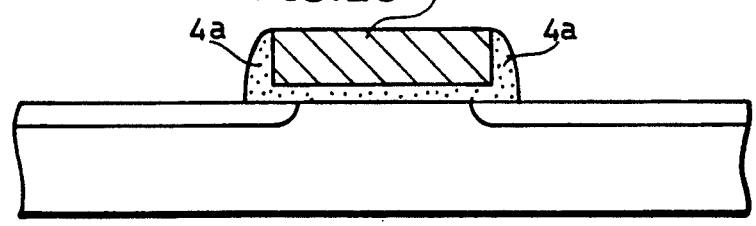

As shown in FIG. 2C, anisotropic etching is performed on the first silicon oxide film 13 using a reactive ion etching method to form sidewall spacers 4a and 4b of the silicon oxide film 13 only on the sidewalls of the gate electrode 3. The anisotropic etching is hardly done in a direction of the film thickness of the sidewall spacers 4a and 4a, that is, the direction parallel to the surface of the substrate. Consequently, the film thickness of the first sidewall spacers 4a and 4a is the same as that of the first silicon oxide film 13.

Figure 2D:
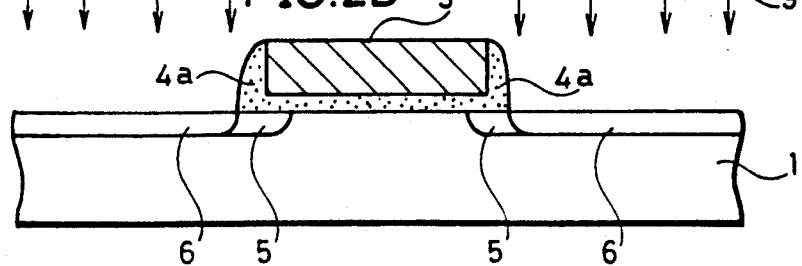

As shown in FIG. 2D, n type impurity ions 9 such as arsenic (As) and the like are implanted on the surface of the p type silicon substrate 1 by a dosage of $1 \times 10^{15}/cm^2$ using the gate electrode 3 and the first sidewall spacers 4a and 4a as a mask to form n$^+$ impurity regions 6 and 6 with high concentration on the p type silicon substrate 1. As shown in the figure, the offset distance between the n$^-$ impurity region 5 and n$^+$ impurity region 6 is defined by the film thickness of the first sidewall spacer 4a.

Figure 2E:
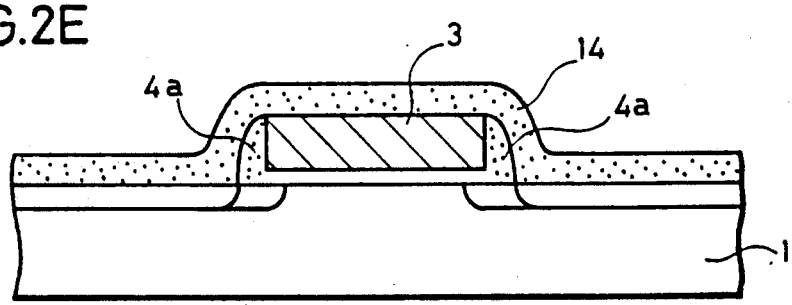

As shown in FIG. 2E, a second silicon oxide film 14 is formed on the surface of the p type silicon substrate, the first sidewall spacers 4a and 4a and the gate electrode 3 using a low pressure CVD method. The second silicon oxide film 14 serves as a mask for separating the silicide layer along with the first sidewall spacers 4a and 4a comprising the first silicon oxide film 13 in a subsequent step of forming the silicide structure. Therefore, the film thickness of the second silicon oxide film 14 is set such that the thickness may be enough to serve as a mask for separation. The thickness is set at approximately 1500~2000 Å in this embodiment.

Figure 2F:
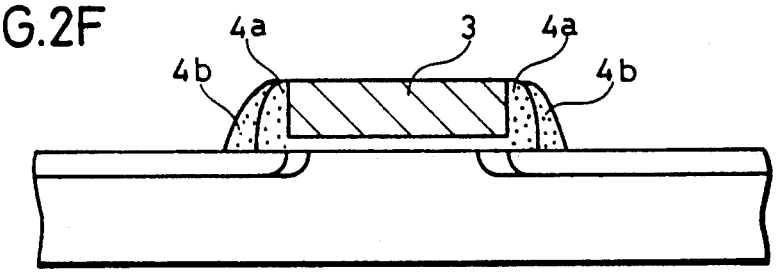

As shown in FIG. 2F, anisotropic etching is performed on the second silicon oxide film 14 using a reactive ion etching method to form second sidewall spacers 4b and 4b comprising the second silicon oxide film 14 on the sidewalls of the first sidewall spacers 4a and 4a. As a result, the sidewall spacers of the silicon oxide films of approximately 2500~3000 Å in thickness are formed on the sidewalls of the gate electrode 3. Then, heat treatment is performed at approximately 800~900° C. in order to activate the n⁻ impurity regions 5 and 5 or the n+ impurity regions 6 and 6. The n⁻ impurity regions 5 and 5 the n+ impurity regions 6 and 6 are diffused also toward a channel direction by this heat treatment. Therefore, by controlling the temperature and time of this heat treatment, the heat treatment is performed until the interface between the n⁻ impurity region 5 and the n+ impurity region 6 almost corresponds to the position of the sidewalls of the gate electrode 3. As an example, the heat treatment was done by using RTA lamp annealing method in $N_2$ gas at 700° C. As a result, the n⁻ impurity regions 5 and 5 constituting the LDD structure are formed on the position just beneath the gate electrode 3.

Figure 2G:
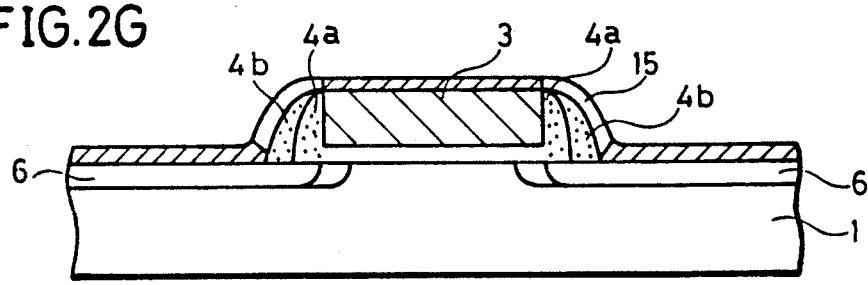

As shown in FIG. 2G, a titanium layer 15 is formed on the surface of the p type silicon substrate 1, the first and second sidewall spacers 4a and 4b and the gate electrode 3 using a sputtering method. Then, heat treatment is performed at a high temperature between approximately 700~1050° C. using a lamp heating method and the like. A reaction is generated on a region of the titanium layer 15 in contact with the silicon layer on the surface of the p type silicon substrate 1 or the polysilicon layer on the surface of the gate electrode 3 through this heat treatment to form titanium silicide layers 7a and 7b. Diffusion hardly occurs in the impurity regions 5 and 6 during this heat treatment. The first sidewall spacers 4a and 4a and the second sidewall spacers 4b and 4b serve as a separation mask for forming the titanium silicide layers 7a and 7b in a selective and self-aligning manner on the surface of the gate electrode 3 and the surface of the n+ impurity regions 6 and 6, respectively. The short between the silicide layers 7a and 7b is prevented by making thick the total film thickness of the first and second sidewall spacers 4a and 4b and by separating the space of the titanium layer 15 between the positions on the surface of the gate electrode 3 and the surface of the n+ impurity region 6 by a predetermined distance.

Figure 2H:
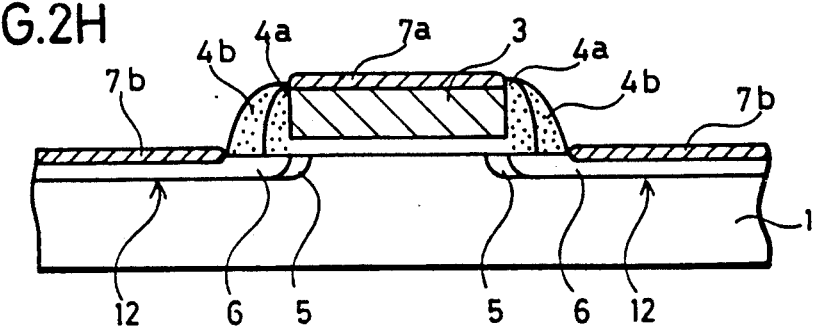

Then, as shown in FIG. 2H, the region of the unreacted titanium layer 15 on the surface of the first and second sidewall spacers 4a and 4b is removed. According to the above described steps, there is manufactured the MIS transistor 12 having the LDD structure and the salicide structure.

Figure 3A:
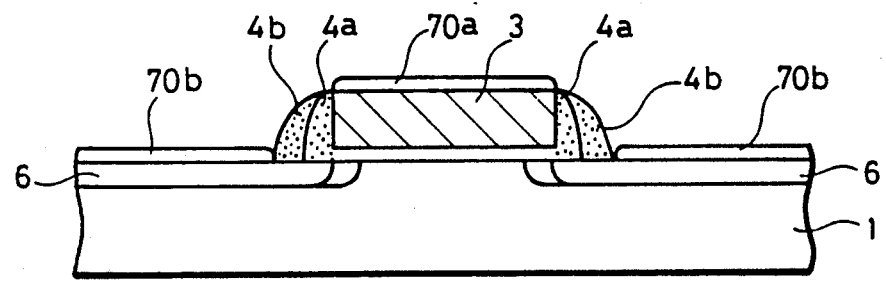
FIGS. 3A and 3B are cross sectional views showing steps of manufacturing the MOS transistor showing another embodiment of the present invention.
Figure 3B:
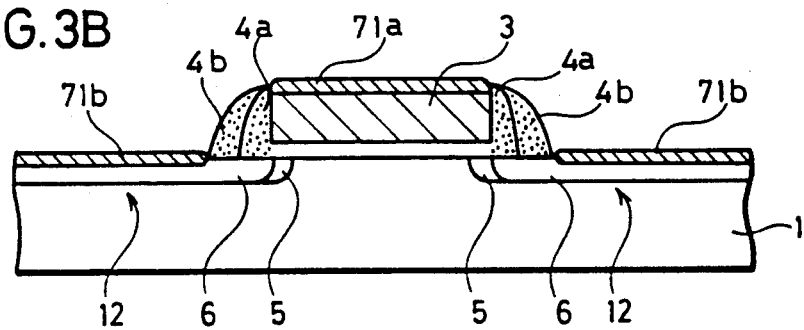
Figure 4:
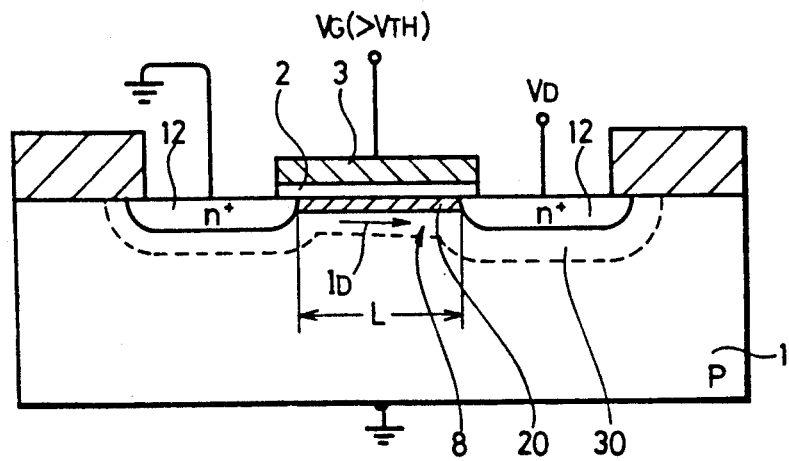
FIG. 4 is a cross sectional of a typical MOS transistor.
Figure 5:
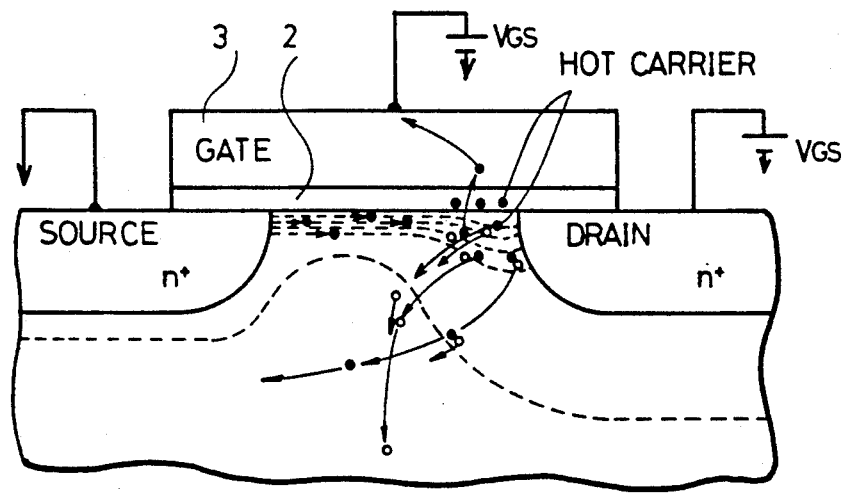
FIG. 5 show hot electron effect of the MOS transistor.
Figure 7A:
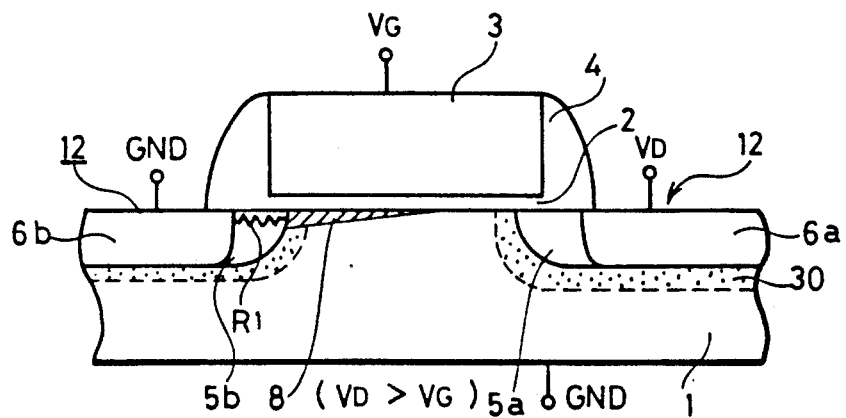
FIGS. 7A and 7B show operation of a conventional LDD MOS transistor.
Figure 7B:
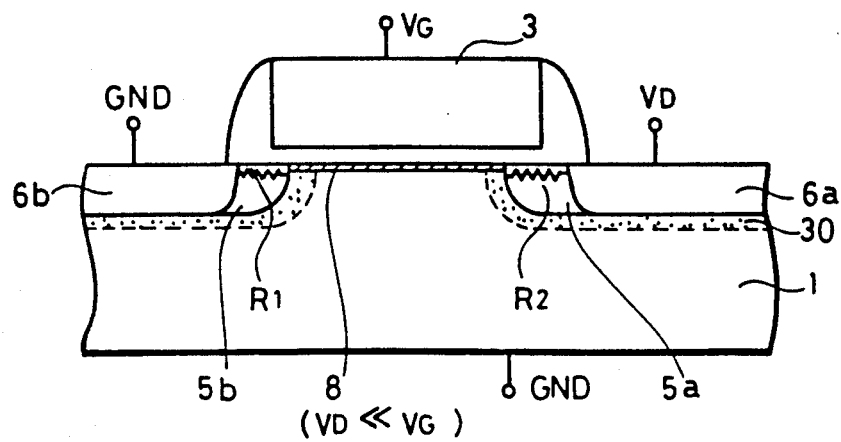
Figure 6:
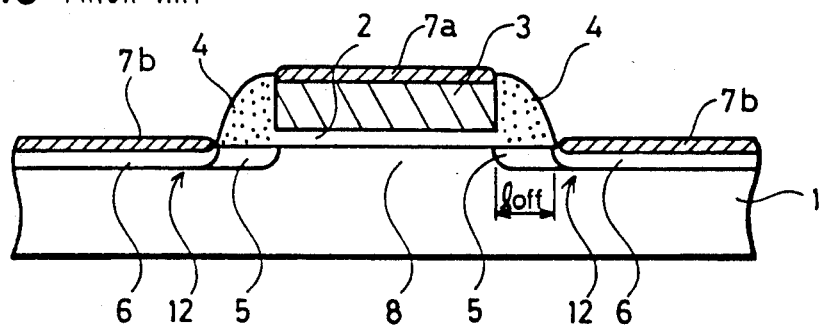
FIG. 6 is a sectional view of a MIS transistor manufactured by a conventional method.
Figure 8A:
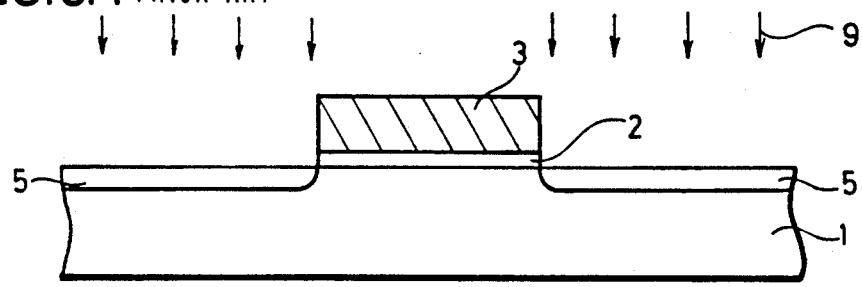
FIGS. 8A, 8B, 8C and 8D are sectional views of the conventional MIS transistor showing its manufacturing steps.
Figure 8B:
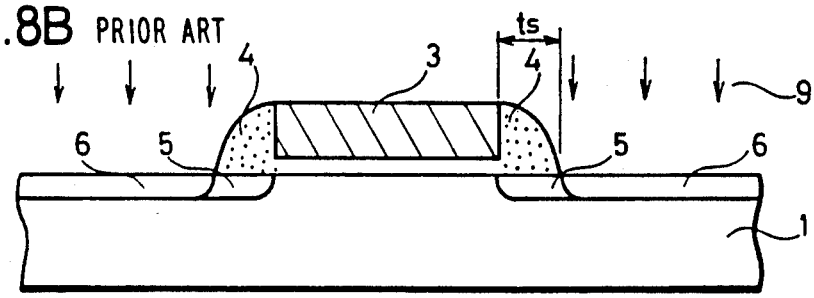
Figure 8C:
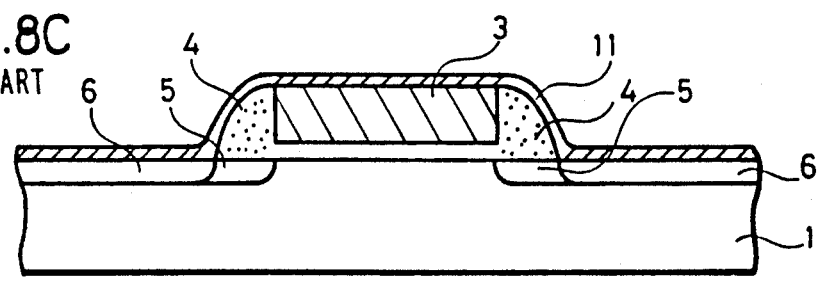
Figure 8D:
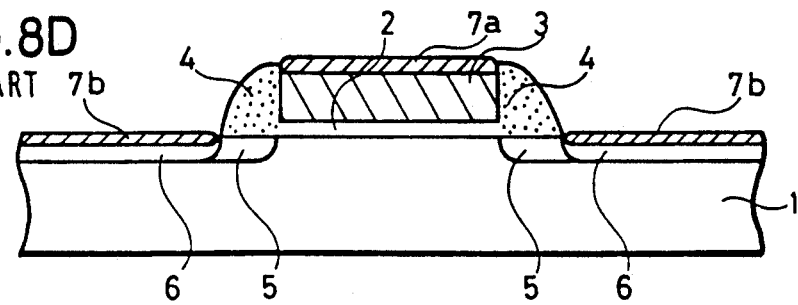

A modification of the manufacturing method described above will be shown in the following. Referring to FIG. 2F, sidewall spacers 4a and 4b of double structure are formed on the sidewalls of the gate electrode 3. Referring to FIG. 3A, tungsten layers 70a and 70b are deposited by selective CVD method of surfaces on the n+ impurity regions 6•6 and on the gate electrode 3. This method utilizes the nature of tungsten, that tungsten is deposited much more on the silicon surface than on an oxide film. By this method, the tungsten layers can be selectively formed on the silicon surface. Thereafter, referring to FIG. 3B, thermal processing at a temperature higher than 650° C. is carried out in an inactive gas atmosphere. By the thermal processing, the tungsten layers 70a and 70b react with the silicon surface, providing tungsten silicide layers 71a and 71b. Molybdenum silicide layers can also be formed by this method.

Although the example in which the present invention was applied to the n type MOS transistor was shown in the above-described embodiment, it is also applied to a p type MOS transistor.

In addition, although a description was made of the case in which titanium silicide is formed as a silicide layer in the above described embodiment, another refractory metal silicide may be formed.

As described above, the LDD structure with a defined offset amount of the n⁻ impurity region 5 with low concentration and the n+ impurity region 6 with high concentration is constituted by making use of the first sidewall spacer 4a as a mask in the present invention. In addition, by adding a heat treatment process shown in FIG. 2F, there is provided a gate overlap type LDD structure in which the n⁻ impurity region 5 with low concentration is entered just under the gate electrode 3. As a result, it becomes possible to prevent the fluctuation of a threshold voltage due to the generation of a breakdown phenomenon or hot carrier, the degradation of a life for reliability to implement the MIS transistor having an excellent transistor characteristic.

In addition, this gate overlap LDD structure is described in detail, for example in Japanese Patent Application No. 63-251113 filed in Oct. 5, 1988.

In addition, the second sidewall spacer 4b is further formed on the sidewall of the first sidewall spacer 4a, whereby the film thickness of the sidewall spacer is held to a predetermined amount to form a metal silicide layer in a self-aligning manner on the surface of the gate electrode 3 and the source and drain regions 12 and 12, using this sidewall spacer as a mask for separation. As a result, the wiring resistance of the gate electrode and the seat resistance of the source and drain region can be reduced and the high speed responsiveness of the transistor can be ensured.

Consequently, it becomes possible to manufacture the MIS semiconductor device having a fine structure with an excellent transistor characteristic by a synergetic effect of them.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for manufacturing a MIS semiconductor device having a salicide structure and a LDD structure, said method comprising the steps of:

forming a gate insulating film on a main surface of a semiconductor substrate;

forming a uniform thickness of polysilicon on said gate insulating film;

patterning said polysilicon of uniform thickness into a gate electrode of uniform thickness;

introducing impurities into said semiconductor substrate using the patterned polysilicon gate electrode as a mask to form an impurity region with relatively low concentration;

forming a first insulating film on the main surface of said semiconductor substrate and on the surface of said patterned polysilicon gate electrode;

patterning said first insulating film to form a first sidewall spacer on a sidewall of said patterned polysilicon gate electrode by performing anisotropic etching of said first insulating film;

introducing impurities into said semiconductor substrate using said polysilicon gate electrode and said first sidewall spacer as a mask to form an impurity region with relatively high concentration; then forming a second insulating film on the surface of said semiconductor substrate, said first sidewall spacer and said polysilicon gate electrode;

patterning said second insulating film to form a second sidewall spacer on a sidewall of said first sidewall spacer by performing anisotropic etching on said second insulating film; and forming a refractory metal silicide layer on the surface of said semiconductor substrate and on an upper surface of said gate electrode.

2. A method for manufacturing a MIS semiconductor device in accordance with claim 1, wherein said step of forming said refractory metal silicide layer comprises the steps of:

depositing a refractory metal at least on said semiconductor substrate and said polysilicon gate electrode; and forming a refractory metal silicide layer in contact only with the surface of said semiconductor substrate and said polysilicon gate electrode by heat treatment to said refractory metal deposition.

3. A method for manufacturing a MIS semiconductor device in accordance with claim 2, wherein tungsten is selectively deposited by Chemical Vapor Deposition method on the surface of said semiconductor substrate and on the polysilicon gate electrode.

4. A method for manufacturing a MIS semiconductor device in accordance with claim 1, wherein said step of forming said refractory metal silicide layer further comprises the steps of:

depositing a refractory metal at least on said semiconductor substrate, said first and second sidewall spacers and said polysilicon gate electrode;

forming a refractory metal silicide layer in contact only with the surface of said semiconductor substrate and said polysilicon gate electrode by heat treatment to said refractory metal deposition; and removing any region in which said refractory metal is not silicided by said heat treatment.

5. A method for manufacturing a MIS semiconductor device in accordance with claim 4, wherein titanium is deposited on said semiconductor substrate, said first and second first sidewall spacers and on the surface of said polysilicon gate electrode.

6. A method for manufacturing a MIS semiconductor device in accordance with claim 1, wherein the thickness of said first sidewall spacer is selected to optimize the length of said impurity region with a relatively low concentration in a channel direction of the MIS semiconductor device, and wherein the thickness of said second sidewall formed on said first sidewall spacer is selected to optimize the separation length between the silicide layer to be formed on said impurity region with high concentration and the silicide layer to be formed on said polysilicon gate electrode by the first and second sidewall spacers.

7. A method for manufacturing a MIS semiconductor device in accordance with claim 1, further comprising the steps of moving the interface between said impurity region with low concentration and said impurity region with high concentration to the position almost corresponding to the sidewalls of said polysilicon gate electrode by diffusing said impurity region with low concentration and said impurity region with high concentration after heat treatment, between said step of forming the impurity region with relatively high concentration and said step of forming the refractory metal layer.

8. A method for manufacturing a MIS semiconductor device in accordance with claim 1, wherein the impurity region with relatively low concentration formed in said semiconductor substrate is formed such that one portion of said impurity region with low concentration may be entered just under said polysilicon gate electrode by diagonal implantation into the main surface of said semiconductor substrate.

9. A method for manufacturing a MIS semiconductor device in accordance with claim 1, wherein the step of patterning the first insulation film comprises forming the first sidewall spacer on the sidewall of said patterned polysilicon gate electrode and on said main surface of said semiconductor substrate and in contact with said gate insulating film.

10. A method for manufacturing a MIS semiconductor device having a salicide structure and a LDD structure, said method comprising the steps of:

forming a gate insulating film on a main surface of a semiconductor substrate and patterning a polysilicon gate electrode on said gate insulating film to cover only a portion of the main surface of said semiconductor substrate;

introducing impurities into portions of said semiconductor substrate uncovered by said gate electrode by using the patterned polysilicon gate electrode as a mask to form an impurity region with relatively low concentration;

forming a first insulating film on the uncovered portions of said main surface of said semiconductor substrate and on the surface of said patterned polysilicon gate electrode;

patterning said first insulating film to form a first sidewall spacer on a sidewall of said patterned polysilicon gate electrode by performing anisotropic etching of said first insulating film;

introducing impurities into said semiconductor substrate using said polysilicon gate electrode and said first sidewall spacer as a mask to form an impurity region with relatively high concentration; then forming a second insulating film on the surface of said semiconductor substrate, said first sidewall spacer and said polysilicon gate electrode;

patterning said second insulating film to form a second sidewall spacer on a sidewall of said first sidewall spacer by performing anisotropic etching on said second insulating film; and forming a refractory metal silicide layer on the surface of said semiconductor substrate and on an upper surface of said gate electrode.

11. A method for manufacturing a MIS semiconductor device in accordance with claim 10, wherein the step of patterning the first insulating film comprises forming the first sidewall spacer on the sidewall of said patterned polysilicon gate electrode and on said main surface of said semiconductor substrate and in contact with said gate insulating film.

* * * * *